United States Patent [19]

Uenishi

[11] Patent Number: 5,729,031

[45] Date of Patent: Mar. 17, 1998

[54] HIGH BREAKDOWN VOLTAGE SEMICONDUCTOR DEVICE

[75] Inventor: Akio Uenishi, Hyogo, Japan

[73] Assignee: Mitsubishi Denki Kabushiki Kaisha, Tokyo, Japan

[21] Appl. No.: 677,753

[22] Filed: Jul. 10, 1996

[30] Foreign Application Priority Data

Jan. 16, 1996 [JP] Japan ..................... 8-004811

[51] Int. Cl.$^6$ .......................... H01L 29/74; H01L 31/111
[52] U.S. Cl. ...................... 257/139; 257/133; 257/135; 257/140; 257/378
[58] Field of Search ...................... 257/133, 135, 257/378, 139, 140, 143, 147–149

[56] References Cited

U.S. PATENT DOCUMENTS

| | | | |
|---|---|---|---|
| 5,162,876 | 11/1992 | Kitagawa et al. | 257/138 |
| 5,200,632 | 4/1993 | Sakurai | 257/212 |
| 5,331,184 | 7/1994 | Kuwahara | 257/139 |
| 5,379,089 | 1/1995 | Uenishi et al. | 396/159 |
| 5,396,087 | 3/1995 | Baliga | 257/139 |
| 5,397,905 | 3/1995 | Otsuki et al. | 257/133 |

FOREIGN PATENT DOCUMENTS

| | | |
|---|---|---|
| 4-30476 | 2/1992 | Japan . |
| 4-312981 | 11/1992 | Japan . |
| 5-48111 | 2/1993 | Japan . |
| 6-85269 | 3/1994 | Japan . |
| 6-326317 | 11/1994 | Japan . |

Primary Examiner—Mahshid D. Saadat
Assistant Examiner—Allan R. Wilson
Attorney, Agent, or Firm—Lowe, Price, LeBlanc & Becker

[57] ABSTRACT

A p type collector region is formed at the side of collector surface of an $n^-$ region with an n type buffer region. This p type collector region has a structure including a p type impurity region and a $p^+$ impurity region. Impurity concentrations of the p type impurity region, the $p^{30}$ impurity region and the n type buffer region are of a prescribed relationship, and the diffusion depth of the p type impurity region from the collector surface is not lower than 2.0 µm. Thus, a semiconductor device in which turn-off loss is sufficiently low and which is not likely to be affected by thermal treatment upon formation of each of the impurity V regions can be obtained.

6 Claims, 13 Drawing Sheets

TIME

HIGH BREAKDOWN VOLTAGE SEMICONDUCTOR DEVICE

BACKGROUND OF THE INVENTION

1. Field of the Invention

The present invention relates to a semiconductor device, and more particularly to a structure of a high breakdown voltage semiconductor device employed for a high voltage inverter or the like.

2. Description of the Background Art

In a high voltage inverter or the like, a high breakdown semiconductor device of high speed and low on-voltage is required. Conventionally, a GTO (Gate Turn-Off) thyristor element has been used in an area of the order of several thousand volts, but consideration is now being made on increase of the breakdown voltage of IGBT (Insulated Gate Bipolar Transistor) in which higher speed is possible.

FIG. 12 is a schematic cross sectional view showing a structure of one cell of a conventionally considered high breakdown voltage IGBT. Referring to FIG. 12, the conventional high breakdown voltage IGBT has an n⁻ region (substrate) 1, an n type buffer region 2, a p⁺ collector region 103, a p type well region 4, an n⁺ emitter region 5, a gate insulating layer 6, a gate electrode layer 7, a collector (anode) electrode 9, and an emitter (cathode) electrode 10.

Here, the surface in contact with collector electrode 9 of n⁻ substrate 1 will be referred to as a collector surface, and the surface in contact with emitter electrode 10 will be referred to as an emitter surface. At the emitter surface of n⁺ region 1, p type well region 4 is formed selectively. At the surface of this p type well region 4, n⁺ emitter region 5 is formed. Gate electrode layer 7 is formed on a channel region which is the surface region of p type well region 4 between n⁻ region 1 and n⁺ emitter region 5, with a gate insulating layer therebetween. Cathode electrode 10 is formed to be in contact with p type well region 4 and n⁺ emitter region 5.

Cathode electrode 10 and gate electrode layer 7 are insulated from each other by an insulating layer 8 which covers gate electrode layer 7.

The p⁺ collector region 103 is formed at the collector surface of n⁻ region 1. Between p⁺ collector region 103 and n⁻ region 1, n type buffer region 2 is formed. Anode electrode 9 is formed to be in contact with p⁺ collector region 103.

The structure of this IGBT including the gate electrode, the emitter and the like at the side of the cathode (emitter) is substantially similar to the structure of an IGBT having a breakdown voltage no higher than 1000 V. Generally, a thick n⁻ substrate 1 with low impurity concentration is employed in order to obtain a high breakdown voltage, and n type buffer region 2 and p⁺ collector region 103 are arranged in a diffused manner to reduce the loss by forming a pin structure.

In this conventional example, a so-called collector short-circuited structure in which there is a portion where p⁺ collector region 103 is not formed, and in which anode electrode 9 and n type buffer region 2 are short-circuited by semiconductor region 2a is employed, aiming particulary at stabilization of high voltage operation.

FIG. 13 shows an example of an inductive load turn-off operation waveform of a diode-clamped IGBT element with a saturation voltage of 3.25 V, having a structure as described above. Referring to FIG. 13, a large tail current appears in the collector current (Ic) waveform between time t=5 μs and t=14 μs, and it takes a long time after the rise of collector voltage ($V_{ce}$) for collector current $I_c$ to start decreasing. Thus, in this collector short-circuited structure, there has been a problem that the turn-off loss, that is the loss of power at the time of turning-off, is large.

Also, in the collector short-circuited structure shown in FIG. 12, electron passes through n type semiconductor region 2a to collector electrode 9 upon turning-on. Accordingly, voltage drop exceeding the magnitude of junction potential of n type buffer region 2 and p⁺ collector region 103 is not likely.

More particularly, in this collector short-circuited structure, forward bias condition is not fully satisfied for the junction between p⁺ collector region 103 and n type buffer region 2 until the sum of the values of the voltage drop owing to current flowing to resistor R1 at short-circuited portion 2a and the voltage drop owing to lateral current flowing to lateral resistor R2 at n type buffer region 2 is made higher than approximately 0.7 V. Accordingly, if resistance values of resistors R1 and R2 are low, implantation of hole from p⁺ collector region 103 to n⁻ region 1 hardly occurs, and the element would operate like an MOSFET (Metal Oxide Semiconductor Field Effect Transistor) having a high on-resistance. Therefore, in order to obtain a low on-voltage as IGBT even when the current density is as low as about 1 A/cm², resistance values of resistors R1 and R2 must be made sufficiently high.

In an ordinary structure including p⁺ collector region 103 and n type buffer region 2, however, R2>>R1. Accordingly, in order to obtain resistor R2 of a value that is practical, it is necessary to set the width of the interval L between the short circuited portions 2a extremely large, namely about several hundred μm. This short-circuit interval L is very wide in comparison to the cell size of the IGBT which is apporoximately several tens of μm (or, in a trench type IGBT, approximately several μm. As a result, amount of hole implantation from p⁺ collector region 103 to n type buffer region 2 would be large in the cell of the IGBT far from short-circuited portion 2a within the IGBT element, and small in the cell of the IGBT near short-circuited portion 2a. Accordingly, there has been a problem that operations in the respective IGBT cells within the chip would be largely imbalanced.

In addition, when operating with a large current, the voltage drop between p⁺ collector region 103 and n type buffer region 2 is clamped to about 0.8 V. Accordingly, the current flowing to resistor R1 of the short-circuited portion 2a shown in FIG. 12 would be 0.8/R1, hardly depending upon the collector current density. Therefore, when collector current density is high, the ratio of current flowing in short-circuited portion 2a would be small with respect to the collector current density, so that the effect of short-circuited portion 2a is more and more degraded and a large amount of hole implantation is performed on n⁻ region 1, almost like in the case of an element without any short-circuited portion. The large tail current is observed in the collector current waveform of FIG. 13 because of the fact that it takes time to withdraw such a large amount of implanted holes upon turning-off.

In addition, in an application of an inverter, a circuit as shown in FIG. 15 is generally employed. Referring to FIG. 15, high-speed diodes D1 and D2 are connected to main switches S1 and S2 formed of IGBTs in a reversed pararell manner in this circuit, and current flowing to inductive load L is fed back to power supplies P1 and P2. In this circuit, the IGBTs forming the main switches may be biased reversely owing to forward voltage drop of the diode (also including a transitional voltage drop) which occurs when feeding back the current to the diode. More particularly, when switch S1 is turned on in the circuit of FIG. 15, current flows within the circuit along the direction shown by an arrow with solid line. When switch S1 is turned off from this state, current tries to continue flowing to the direction of the arrow with solid line, toward inductive load L. As a result, current tends to flow to the direction shown by an arrow with dotted line, and thus reverse voltage is applied to IGBT of switch S2.

When reverse voltage is applied to the IGBT of the collector short-circuited structure shown in FIG. 12, positive voltage is applied to emitter electrode 10, and negative voltage is applied to collector electrode 9. Accordingly, the junction portion of p type well region 4 and n⁻ region 1 is biased forward, and hole is implanted to n⁻ region 1 from p type well region 4. If voltage applied to the IGBT is reversed before the hole is annihilated by recoupling, this IGBT would be rendered conductive. Thus, there has been a problem that unwanted hole implantation to n⁻ region 1 would cause inaccurate operation of the IGBT.

Japanese Patent Laying-Open No. 6-326317 discloses a structure of an IGBT at the side of the collector in which the above-described problems of the collector short-circuited portion can be solved.

FIG. 16 is a schematic cross sectional view showing a structure of the IGBT at the side of the collector, disclosed in the above publication. Referring to FIG. 16, collector short-circuited portion is not adopted in this structure, and a collector region 203 is of a structure including a p⁺ emitter island 203a and a p type emitter 203b.

Since other portions of the structure is similar to those of the structure of the conventional IGBT shown in FIG. 12, identical members will be denoted by identical reference characters and description thereof will not be provided here.

Even in the structure of Fig, 16, however, there are problems as will be described in the foilwing.

In the structure shown in FIG. 16, the turn-off loss is still too large to provide a sufficient performance and thus improvement has been expected on this point.

In addition, diffusion depth of p type collector region 203b from the collector surface in the structure disclosed in this publication is extremely shallow, about 1.2 µm. Normally, the side of the collector surface is fixed to a lead frame or the like in the process of assembling such as die bonding. Thus, if diffusion depth of p type collector region 203b is small, influence of various stresses tends to appear in the vicinity of the collector surface at the time of this fixing and the like.

Also, in order to form the element such that diffusion depth of p type collector region 203b from the collector surface is extremely shallow in the order of 1.2 µm, thermal treatment after the formation of p type collector region 203b must be taken into consideration. For example, care must be taken so that diffusion depth of p type collector region 203b should not be deeper than 1.2 µm as a result of thermal treatment within n⁺ emitter region 5 after formation of p type collector region 203b. As such, there has been a problem in the process of manufacture that compromise must be made with the condition for thermal treatment for forming each of the impurity regions in the wafer process.

SUMMARY OF THE INVENTION

It is an object of the present invention to provide a semiconductor device having a sufficiently low turn-off loss.

It is another object of the present invention to provide a semiconductor device which is not likely to be affected by thermal treatment when various impurity regions are formed.

In a semiconductor device in accordance with the present invention, main current flows between two main surfaces sandwiching an intrinsic semiconductor substrate or a semiconductor substrate of a first conductivity type, and the semiconductor device is provided with a first impurity region of a second conductivity type, a second impurity region of the first conductivity type, a gate electrode layer, a third impurity region of the second conductivity type, and a fourth impurity region of the first conductivity type. The first impurity region is formed selectively at a first main surface of the semiconductor substrate. The second impurity region is formed selectively at the first main surface within the first impurity region. The gate electrode layer is formed at a channel region which is the first impurity region between a region of the first conductivity type of the semiconductor substrate and the second impurity region, to be opposite to the gate electrode layer with a gate insulating layer therebetween. The third impurity region is formed at a second main surface so as to sandwitch said region of the first conductivity type of said semiconductor substrate with said first impurity region. The fourth impurity region is placed between the third impurity region and the region of the first conductivity type of the semiconductor substrate, and has an impurity concentration higher than that of the region of the first conductivity type of the semiconductor substrate. The third impurity region has a fifth impurity region having a first impurity concentration at the second main surface and a sixth impurity region having a second impurity concentration higher than the first impurity concentration at the second main surface. When it is assumed that the first impurity concentration of the fifth impurity region is $C_{s(p)}$, the second impurity concentration of the sixth impurity region is $C_{s(p+)}$, and the impurity concentration of the fourth impurity region at the second main surface is $C_{s(nbuf)}$, the relationship expressed in the following is satisfied.

$$C_{S(p)} \leq 1.1 \sqrt{C_{S(nbuf)} \times \{C_{S(p+)} + C_{S(p)}\}}$$

The diffusion depth of the fifth impurity region to the fourth impurity concentration from the main surface is not lower than 2.0 µm.

In the semiconductor device of the present invention, respective impurity concentrations of the fourth impurity region which is to be the buffer region and the fifth and sixth impurity regions forming the collector region are set at values which satisfy a prescribed relationship. Accordingly, turn-off loss obtained can be made sufficiently low.

In addition, since the diffusion depth of the sixth impurity region forming the collector region is no smaller than a prescribed depth, the junction portion of the sixth impurity region and the fourth impurity region is not likely to be influenced by various types of stresses. Also, since the diffusion depth of the sixth impurity region is acceptable if it is not shallwer than a prescribed depth, consideration on the heat treatment upon formation of other impurity regions during the wafer process does not have to be so strict.

Preferably, in the aspect described above, the first impurity concentration $C_{s(p)}$ of the fifth impurity region and the impurity concentration $C_{s(nbuf)}$ of the fourth impurity region at the second main surface satisfy the relationship shown in the following expression.

$$2 \times C_{s(nbuf)} \leq C_{s(p)}$$

Since the values of the impurity concentrations of the fifth impurity region forming the collector region and the fourth impurity region forming the buffer region are set to have a prescribed relationship, a low on-voltage can be obtained.

In the aspect described above, the impurity concentration $C_{s(nbuf)}$ of the fourth impurity region at the second main surface is preferably 1000 times or more than the impurity concentration of the semiconductor substrate.

Thus, stability is obtained upon high voltage operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment in accordance with the present invention will now be described in the following, with reference to the figures.

Figure 1:
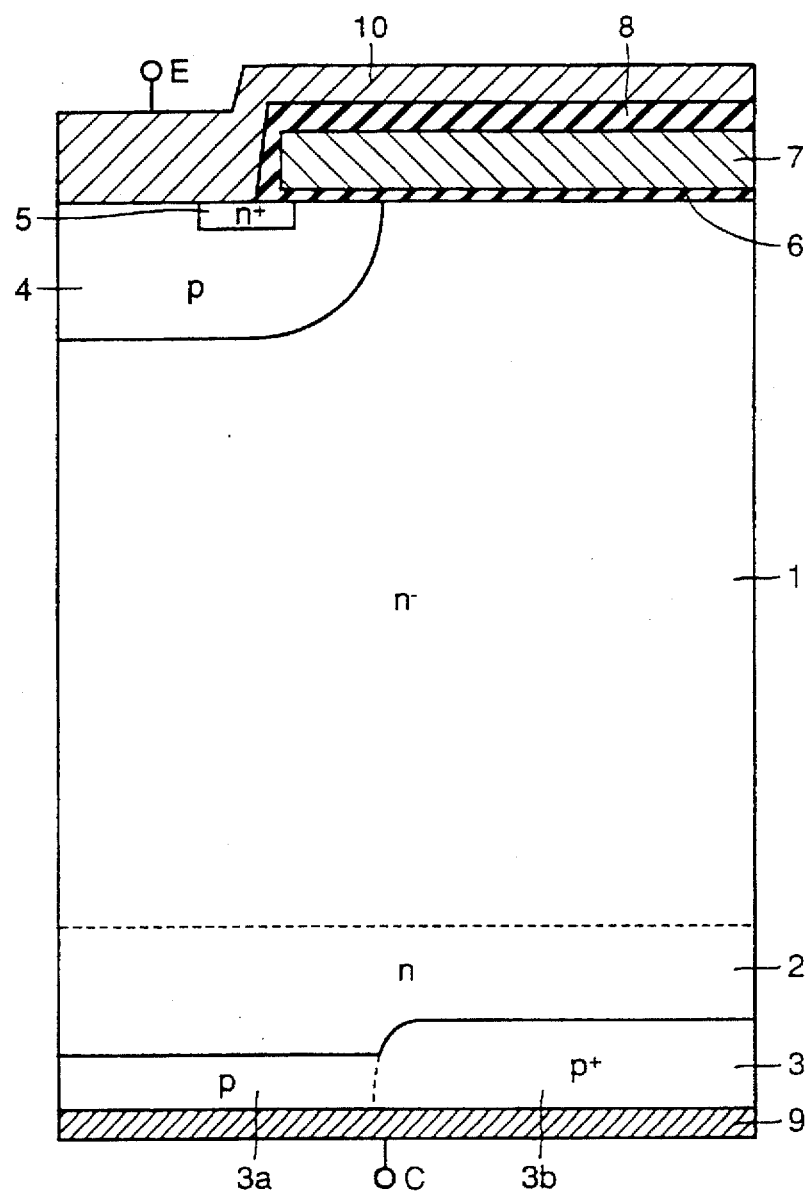
FIG. 1 is a schematic cross sectional view of one cell in a structure of a semiconductor device according to an embodiment of the present invention.
Figure 12:
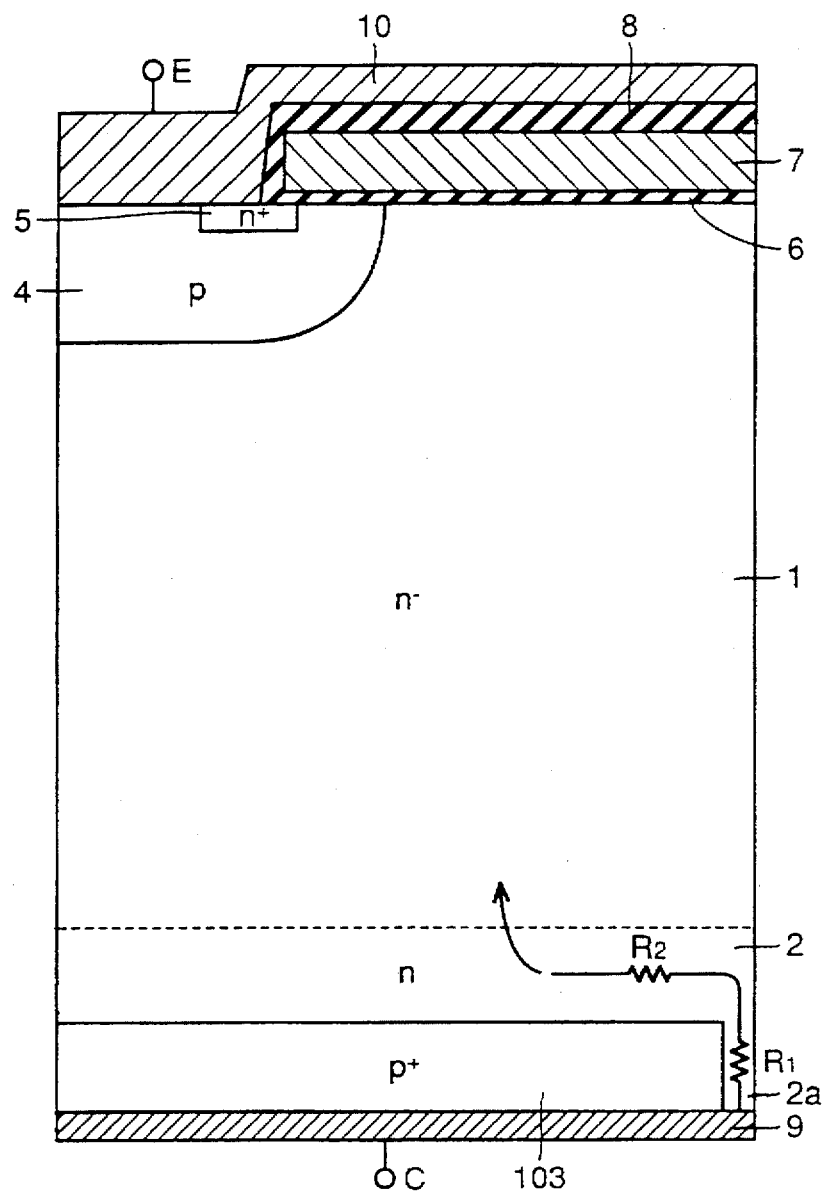
FIG. 12 is a schematic cross sectional view showing one cell of a structure of a conventional semiconductor device.
Figure 13:
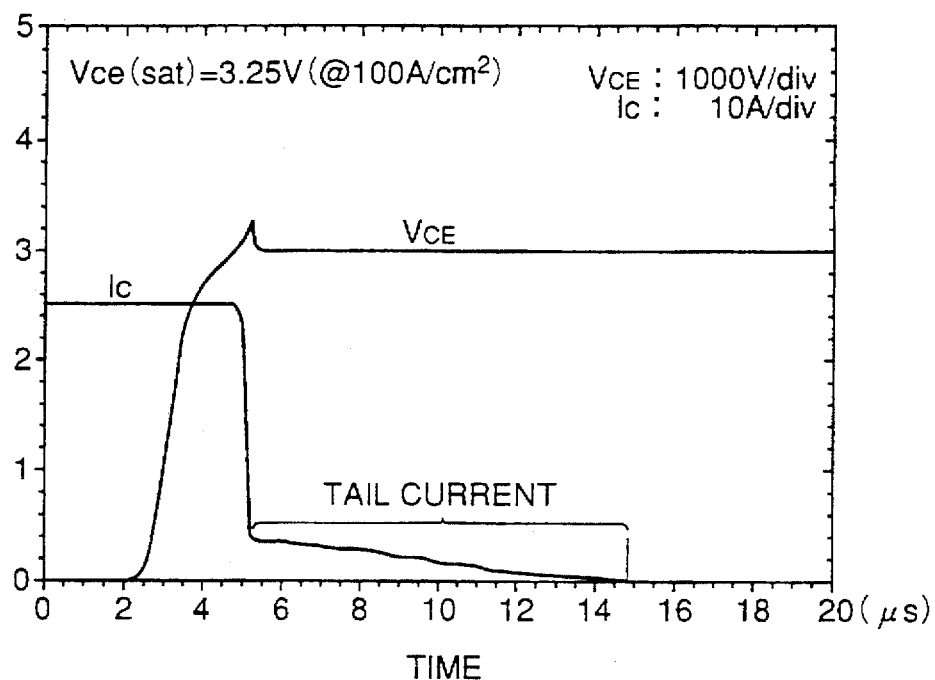
FIG. 13 is a graph showing an example of an inductive load turn-off operation waveform with a diode-clamped IGBT element having a structure shown in FIG. 12 and a saturation voltage of 3.25 V.
Figure 14:
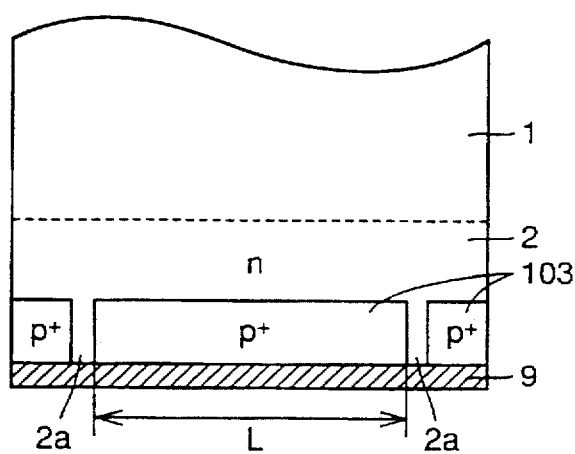
FIG. 14 is a schematic cross sectional view for illustrating the interval between the short-circuited portions.
Figure 15:
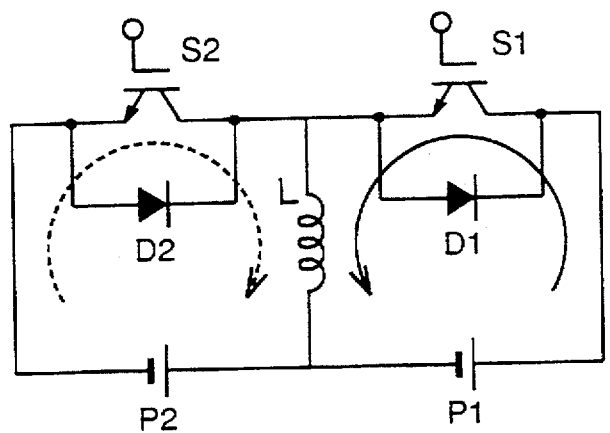
FIG. 15 is a diagram for showing a circuit structure in which an IGBT elememt is generally employed in an application of an inverter.

Referring to FIG. 1, a structure of an IGBT element of the present embodiment differs from the conventional structure shown in FIG. 12 especially in the structure of a p type collector 3.

The p type collector region 3 has a p type impurity region 3a and a p$^+$ impurity region 3b. Impurity concentration $C_{s(p)}$ of p type impurity region 3a at the collector surface is lower than impurity concentration $C_{s(p+)}$ of p$^+$ impurity region 3b at the collector surface. Diffusion depth of p type impurity region 3a from the collector surface is smaller than the diffusion depth of p$^+$ impurity region 3b, but is not smaller than 2.0 µm.

Assuming that impurity concentration of an n type buffer region 2 at the collector surface is $C_{s(nbuf)}$, each of the impurity concentrations $C_{s(p)}$, $C_{s(p+)}$ and $C_{s(nbuf)}$ are set to satisfy the relationship as described in the follwing expression.

$$2 \times C_{S(nbuf)} \leq C_{S(p)} \leq 1.1 \times \sqrt{C_{S(nbuf)} \times \{C_{S(p+)} + C_{S(p)}\}}$$

Impurity concentration $C_{s(nbuf)}$ of n type buffer region 2 at the collector surface is 1000 times or more than the impurity concentration of an n$^-$ region 1.

Since other portions of the structure is substantially similar to those of the conventional structure shown in FIG. 12, the same members are denoted by the same reference characters and description thereof will not be provided here.

Brief description will now be made for a method of forming n$^-$ region 1, n type buffer region 2 and p type collector region 3 in the semiconductor device according to the present embodiment.

Referring to FIG. 1, n$^-$ silicon substrate 1 having a high resistivity is first formed by, for example, the FZ method. Ion implantation of, for example, phosphorous which has large diffusion coefficient is perfomed to the surface at the side of the collector surface of this n$^-$ silicon substrate 1 which is then subjected to thermal diffusion of high temperature for a long time to form n type buffer region 2.

Ion implantation of, for example, a prescribed amount of boron (B) is performed entirely to the collector surface of this n type buffer region 2. Thus, p type impurity region 3a is formed shallower than n type buffer region 2. In addition, a resist pattern having a desired shape is formed on the collector surface. Using this resist pattern as a mask, additional boron is selectively implanted,and thermal diffusion is performed. In this way, p$^+$ impurity region 3b is formed deeper than p type impurity region 3a and shallower than n type buffer region 2 selectively at a desired location.

Description is now made for a method of controlling the main current conductive state and the main current cut-off state in the semiconductor device of the present embodiment.

The main current conductive state (i.e., on-state) is implemented by applying positive (+) voltage to a gate electrode layer 7, with forward bias provided between emitter electrode 10 and collector electrode 9, in other words, with positive (+) voltage applied to collector electrode 9 and negative (−) voltage applied to emitter electrode 10.

First, process of turning-on in which the element is shifted from the off-state to the on-state will be described in the following.

When positive (+) voltage is applied to gate electrode layer 7, an n channel having an extremely high electron concentration which has been inverted to n type (inverted n region) is formed at p type well region 4 in the vicinity of gate insulating layer 6. Electron which acts as one of current carrier (hereinafter referred to as carrier) is implanted to $n^{31}$ region 1 from $n^+$ emitter region 5 through this n channel and flows toward p type collector region 3 to which positive (+) voltage is applied. When this electron reaches p type collector region 3, hole acting as another current carrier is implanted from p type collector region 3 into $n^−$ region 1, and flows toward $n^+$ emitter region 5 to which negative (−) voltage is applied, so as to reach a portion where the above-described n channel is in contact with $n^−$ region 1.

Thereafter, a sufficient amount of carrier is provided from collector electrode 9 and emitter electrode 10 and is stored in $n^−$ region 1 to a concentration 2 or 3 orders of magnitude larger than the concentration of the semiconductor substrate, according to the diferrence in potential applied between the two electrodes. As a result, a low resistance state which is called conductivity modulation by electron-hole pair is exhibited, and turning-on is completed.

A regular state obtained after this turning-on is the on-state.

Main current cut-off state (i.e., off-state) is implemented by applying negative (−) voltage to gate electrode layer 7 even when forward bias is still being applied between collector electrode 9 and emitter electrode 10.

Description is now made for the process of turning-off in which the element shifts from the on-state to the off-state.

When negative (−) voltage is applied to gate electrode layer 7, the n channel (inverted n region) which has been formed in the vicinity of gate electrode layer 7 is annihilated, and supply of electron from $n^+$ emitter region 5 to $n^−$ region 1 is stopped.

Furthermore, as electron density is decreased, concentration of electron which has been implanted into $n^−$ region 1 starts decreasing gradually from the vicinity of $n^+$ emitter region 5. The holes which has been implanted into $n^−$ region 1 to maintain the condition for neutral electrical charge also start decreasing, and p type well region 4 and $n^−$ region 1 are biased reversely. Accordingly, depletion layer starts to spread at the interface of p type well region 4 and $n^−$ region 1 to reach a thickness corresponding to the applied voltage between two elctrodes at the off-state.

In addition, holes outside the above-described depletion region (at the side of p type collector region) in electrically neutral region in which both carriers remain passes through a depleted region to reach emitter electrode 10 via p type well region 4, all of carriers are annihilated, and turning-off is completed.

A regular state obtained after this turning-off is the off-state.

Figure 2:
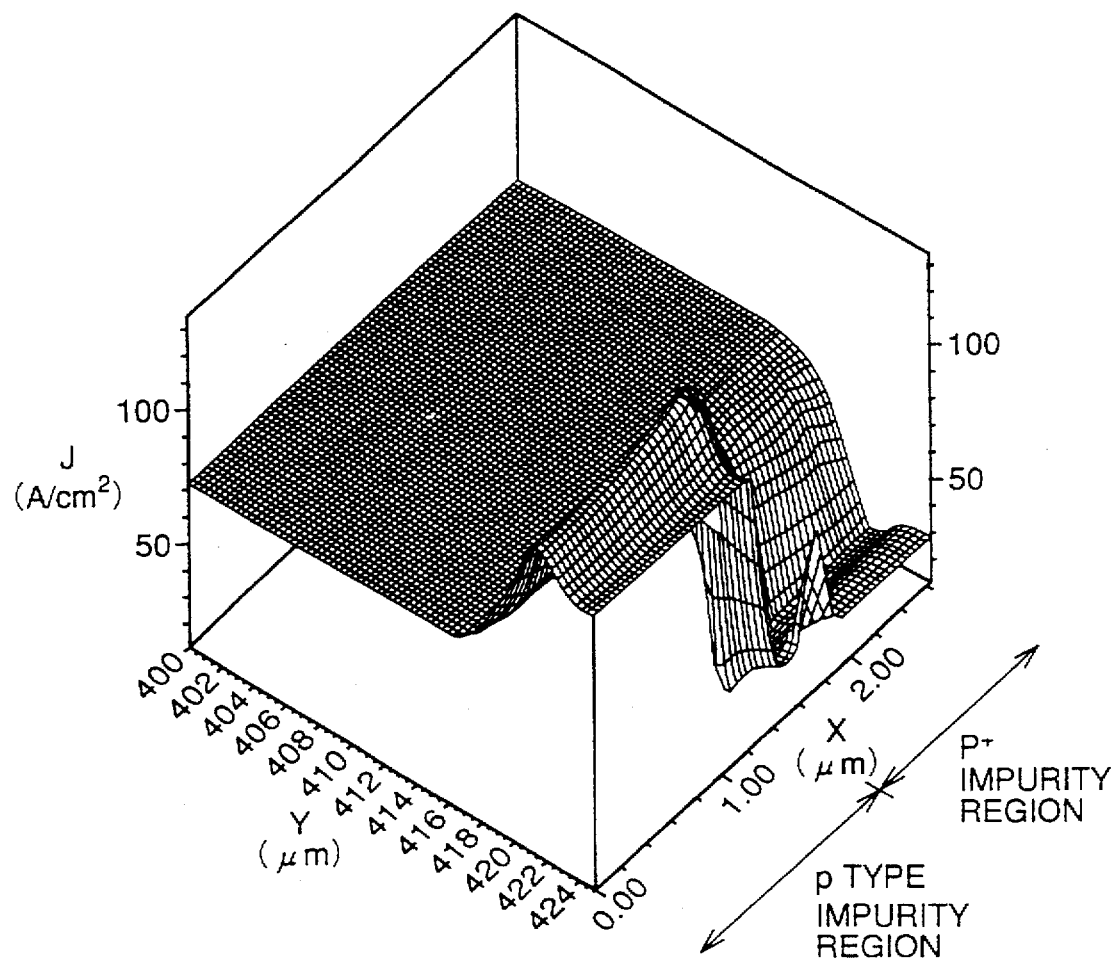
FIG. 2 is a graph showing the result obtained when concentration of p type region is set so that saturation voltage in the structure of FIG. 1 would be about 3 V and culation is made on how the density of electron current is distributed at the side of the collector at on-state.

FIG. 2 shows the result of calculation on how electron current density is distributed in the vicinity of n type buffer region 2 and p type collector region 3 in the on-state when concentration of p type region is set so that the saturation voltage would be about 3 V in the IGBT of FIG. 1.

In this FIG. 2, electron current density J is shown, the lateral dimension in the drawing of FIG. 1 indicated by X and vertical dimension indicated by Y.

Referring to FIG. 2, electron current density in n type buffer region 2 is approximately 70 A/cm$^2$, which occupies about 70% of the total current density. This current is increased to about 130 A/cm$^2$ at the p type impurity region, and on the contrary, is only about 30 A/cm$^2$ in p$^+$ impurity region 3b. This means that electron exists in large amount at n type buffer region 2 but flows out to collector electrode 9 through p type impurity region 3a of a relatively low concentration, and only a small amount flows into p$^+$ impurity region 3b of relatively high concentration. Accordingly, the amount of holes flowing into n type buffer region 2 from p$^+$ impurity region 3b in a manner that compensates for the electron flowing into p$^+$ impurity region 3b is also reduced, and thus amount of hole implantation is suppressed.

Implantation of hole from p type impurity region 3a to n type buffer region 2 is extremely low since impurity concentration of p type impurity region 3a is low.

In addition, owing to the electron current flowing through p type impurity region 3a, the potential difference between n type buffer region 2 and collector electrode 9 would be small. Accordingly, voltage drop is not likely to be larger than the junction potential between n type buffer region 2 and p$^+$ impurity region 3b, which also contributes to reduction of hole implantation from p$^+$ impurity region 3b to n type buffer region 2.

The proportion of the respective impurity concentrations of p type impurity region 3a, p$^+$ impurity region 3b and n type buffer region 2 changes the control level of the amount of hole implantation to n$^−$ region 1.

Figure 3:
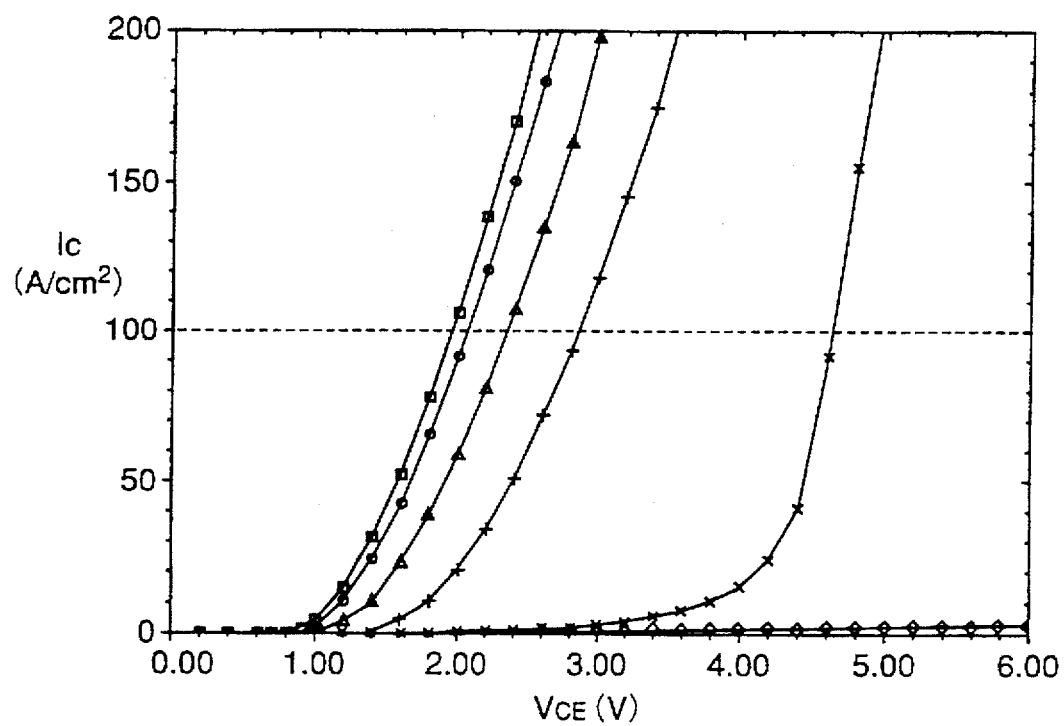
FIG. 3 is a graph showing the result obtained when calculation is made on the on-state property in the case in which an IGBT element is formed with various surface concentrations of p type impurity region at the collector surface.

In the graph of FIG. 3, impurity concentration at the collector surface and junction depth from the collector surface are indicated as $1 \times 10^{18}$ cm$^{-3}$ and 30 μm at n type buffer region 2, respectively, while $5 \times 10^{l8}$ cm$^{-3}$ and 10 μm at p$^+$ impurity region 3b, respectively. The p type impurity region 3a is subjected to the same thermal treatment as the treatment performed on p$^+$ impurity region 3b, and impurity concentration of p type impurity region 3a at the collector surface is varied within the range of $2 \times 10^{18}$ to $5 \times 10^{18}$ cm$^{-3}$. In this case, junction depth of p type impurity region 3a to buffer region 2 was about 2.5 to about 3.8 μm.

Referring to FIG. 3, it is known from this graph that reduction of impurity concentration $C_{s(p)}$ of p type impurity region 3a at the collector region leads to a significant increase in saturation voltage when collector current density Ic is constant. More particulary, saturation voltage is largely changed from 2 V to 6 V or more when collector current density Ic is 100 A/cm$^2$.

Figure 4:
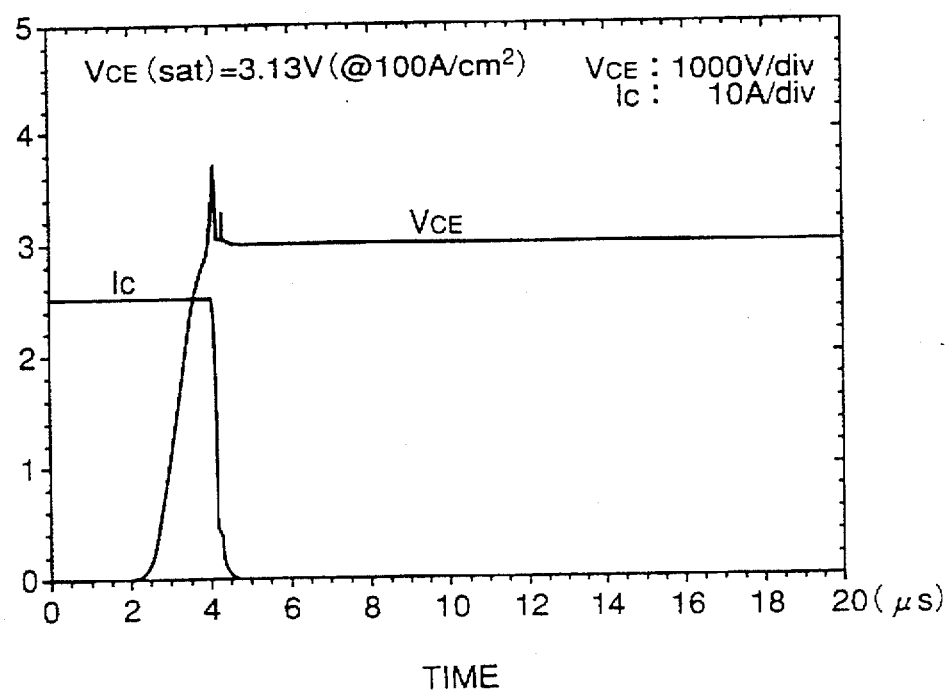
FIG. 4 is a graph showing an example of an inductive load turn-off operation waveform with a diode-clamped IGBT element of the present embodiment having a saturation voltage of 3.13 V in the semiconductor device according to the embodiment of the present invention.

Referring to FIG. 4, it is understood that, in the IGBT element according to the present embodiment, there is a significant reduction in tail current, and at the same time, turn-off loss is also made smaller as compared to the element having the conventional collector short-circuited structure shown in FIG. 12.

This significant reduction in tail current is made possible since amount of holes implanted from p type collector region 3 to n$^−$ region 1 can be reduced even when large current operation is perfomed in the IGBT element of the present embodiment, such that withdrawal of holes within n$^−$ region 1 upon turning-off is completed immediately.

Figure 5:
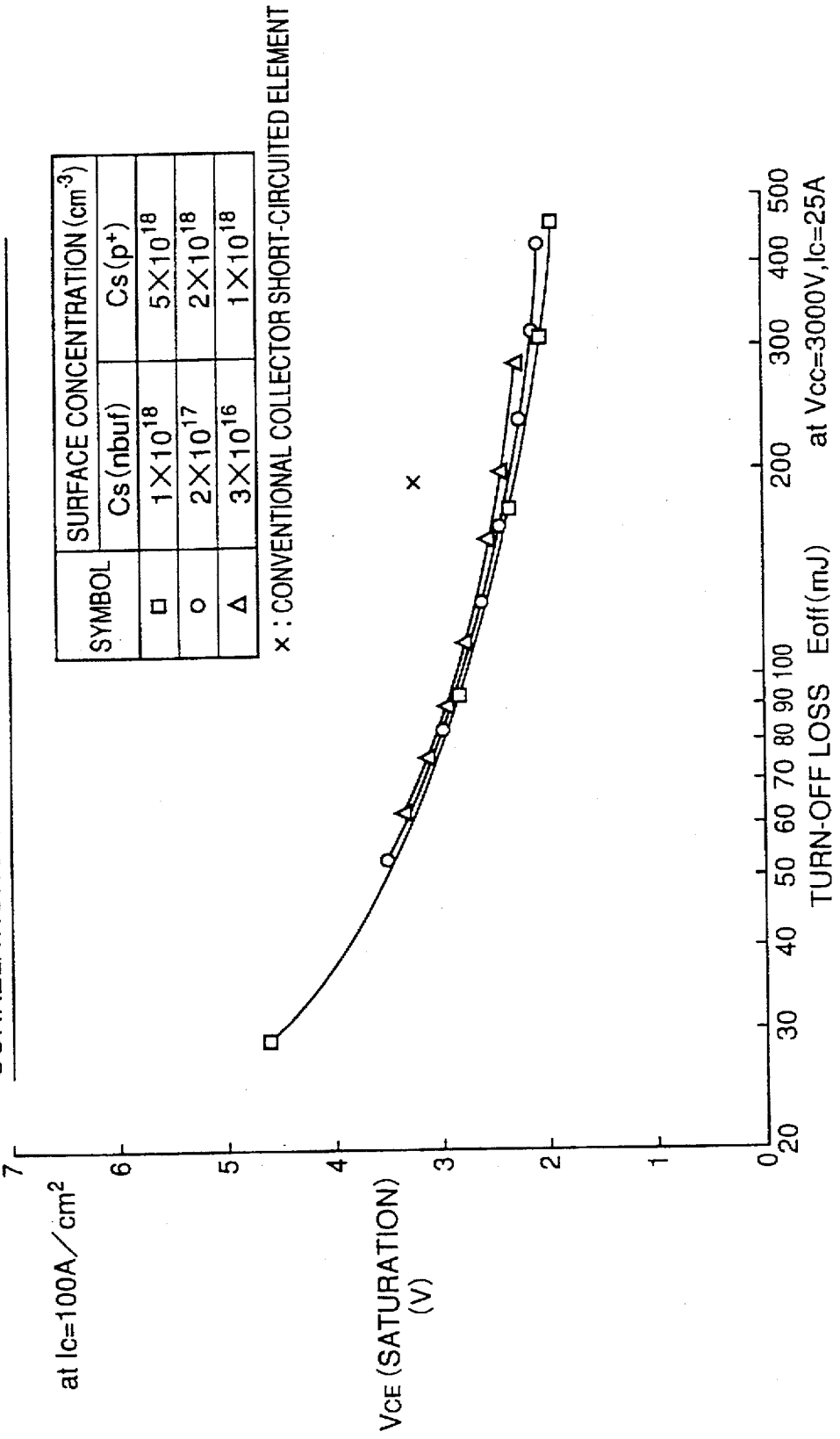
FIG. 5 is a graph showing the result of inspection on the correlation between turn-off-loss and on-voltage at 100 A/cm$^2$ under the same circuit condition as in FIG. 4 with respect to IGBTs of various impurity profiles, employing the impurity concentration of p type impurity region 3a as the parameter.

FIG. 5 is a graph showing the result of inspection on the relationship between turn-off loss Eoff and on-voltage at 100 A/cm$^2$ in the same circuit condition as in FIG. 4 with respect to IGBTs of various impurity profiles, employing the impurity concentration of p type impurity region 3a as the parameter. It can be seen from FIG. 5 that either one of the IGBTs in accordance with the present embodiment would exhibit a better trade-off as compared to the conventional IGBTs of collector short-circuited type (shown by X). Also, among the IGBTs having structures according to the present embodiment, the one with higher concentration in n type buffer region 2 and $p^+$ impurity region 3b shows a slightly better trade-off.

Figure 6:
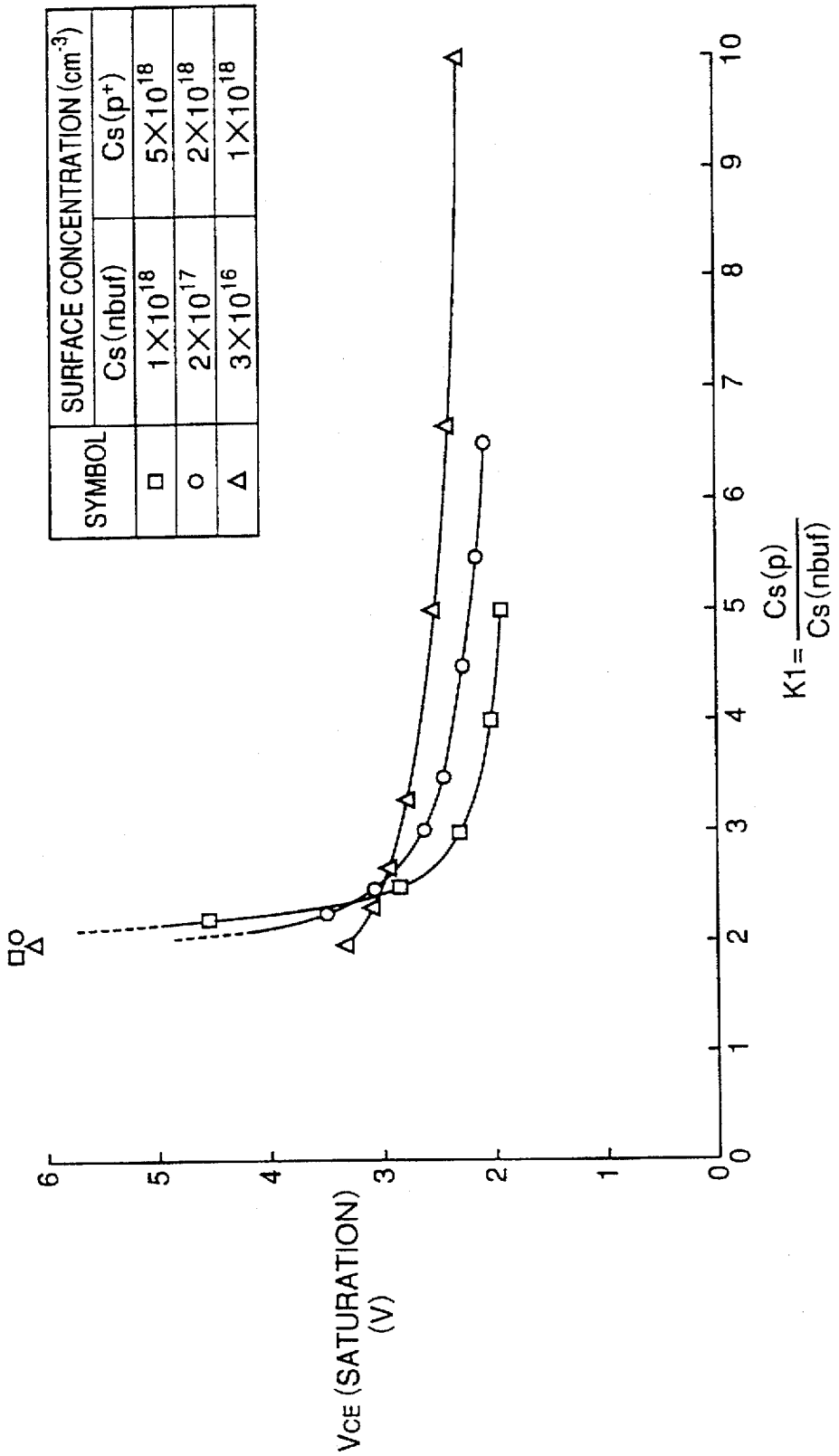
FIG. 6 is a graph showing the result of inspection on how the on-voltage is changed with ratio K1 under various conditions shown in FIG. 5.

FIG. 6 shows that there is a rapid increase in on-voltage when ratio K1 is made lower than 2. Thus, it i known that the lower limit of the surface concentration of p type impurity region 3a has to be two times or more than the surface concentration of n type buffer region 2 in order to maintain a low on-voltage. In FIG. 6, K1 represents the ratio of the surface concentration $C_{s(p)}$ of p type impurity region 3a with respect to the surface concentration $C_{s(nbuf)}$ of n type buffer region 2.

Figure 7:
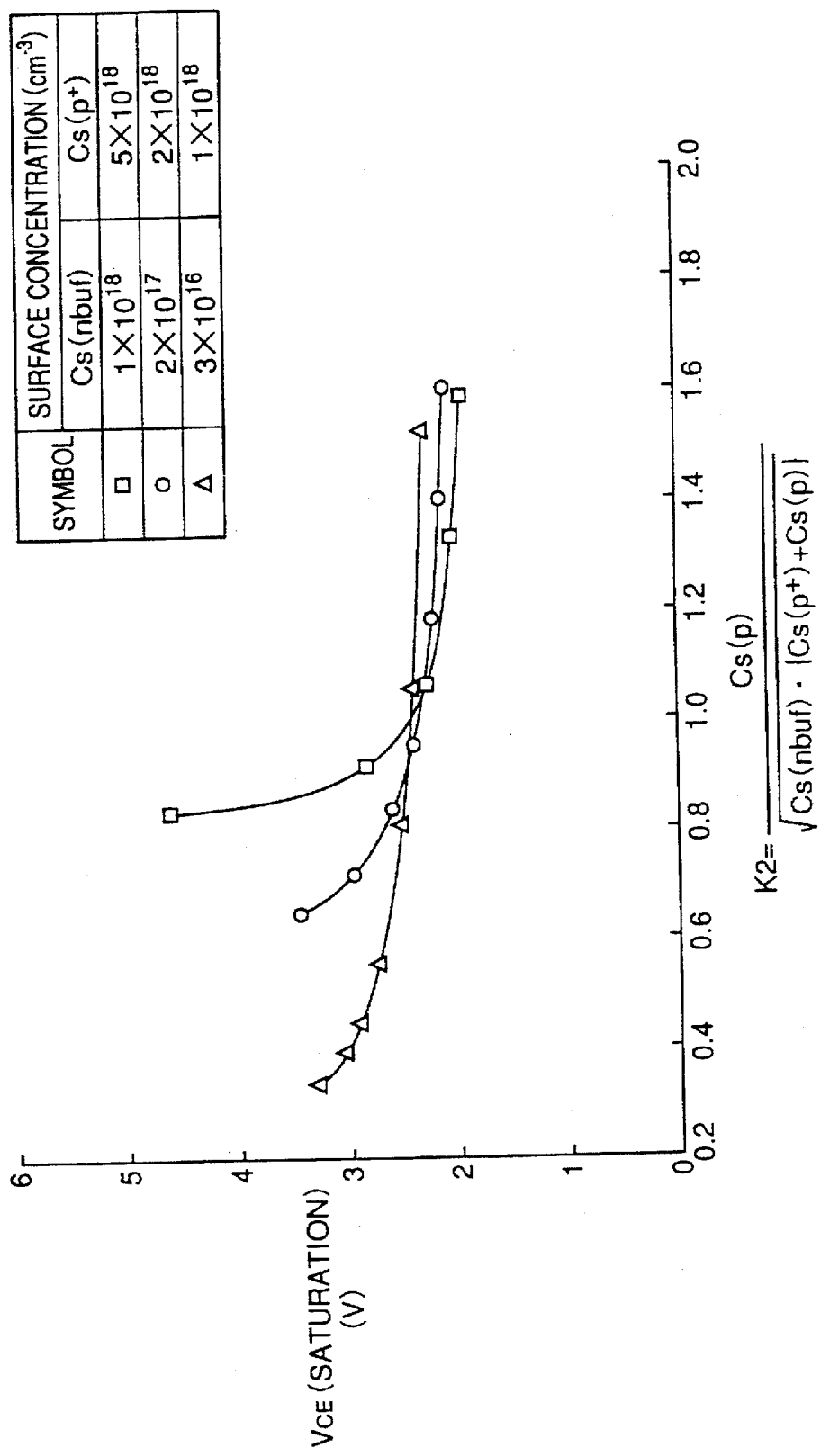
FIG. 7 is a graph showing the result of inspection on how the on-voltage is changed with ratio K2 under various conditions shown in FIG. 5.

FIG. 7 shows that there would be substantially no reduction in the on-voltage when ratio K2 is made larger than 1.1. In FIG. 7, K2 represents the ratio of geometrical mean of the surface concentration $C_{s(p)}$ of p type impurity region 3a, the surface concentration $C_{s(nbuf)}$ of n type buffer region 2, and the surface concentration $C_{s(p+)}$ of $p^-$ impurity region 3b.

Figure 8:
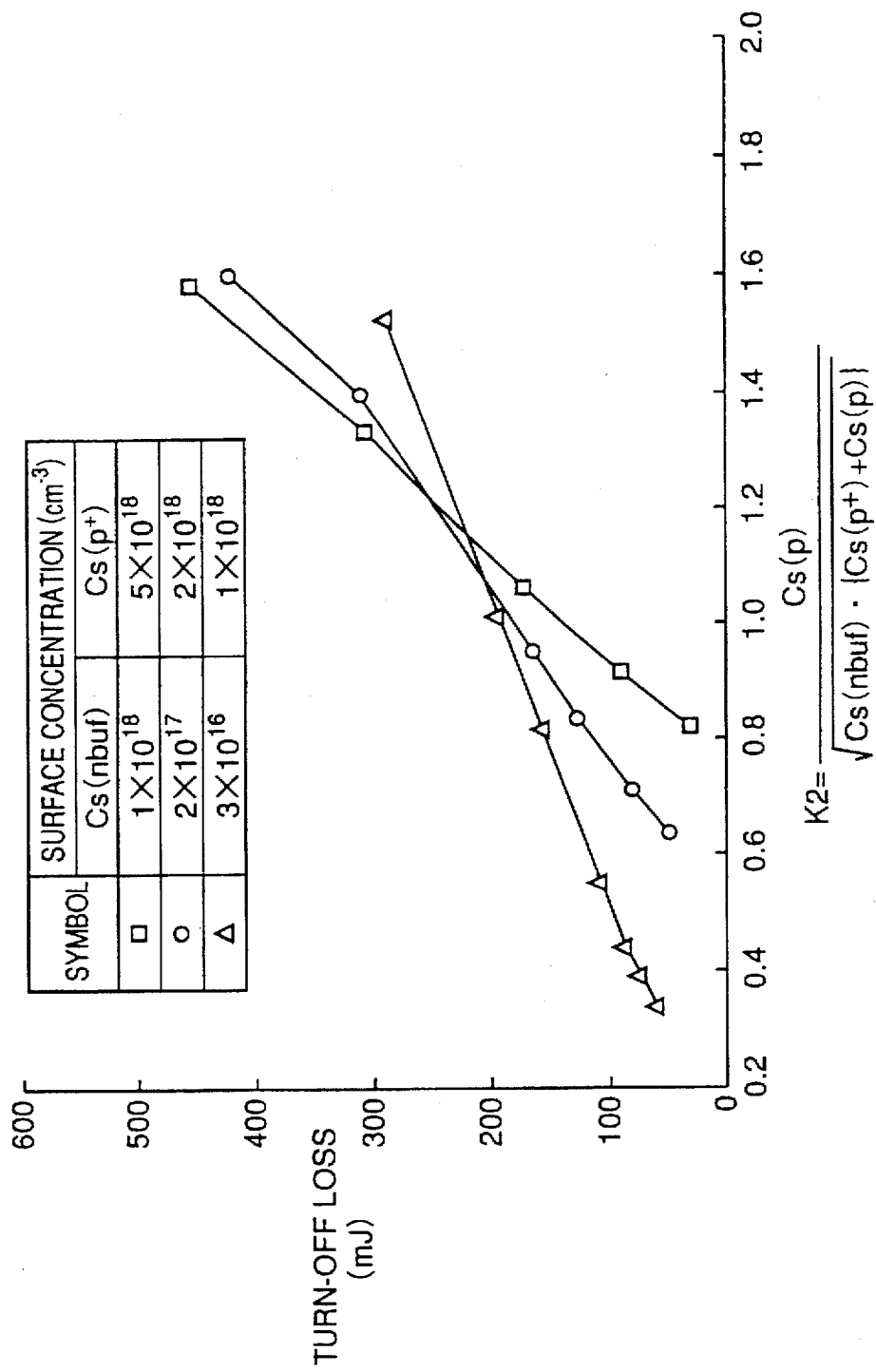
FIG. 8 is a graph showing the result of inspection of how the turn-off loss is changed with ratio K2 under various conditions shown in FIG. 5.

Meanwhile, FIG. 8 shows that the turn-off loss is increased substantially linearly with respect to ratio K2. The gradient varies depending on impurity concentrations of n type buffer region 2 and $p^+$ impurity region 3b, but turn-off loss is substantially the same at ratio K2=1.1–1.2.

In view of FIGS. 7 and 8 described above in combination, it can be understood that surface concentration $C_{s(p)}$ of p type impurity region 3a in the semiconductor device according to the present embodiment should be set so that ratio K2 is not higher than 1.1. This is based on the fact that increase in turn-off loss with no reduction of on-voltage is practically useless.

Thus, low on-voltage can be maintained while reducing the turn-off loss if the relationship of surface concentrations $C_{s(nbuf)}$, $C_{s(p)}$ and $C_{s(p+)}$ of n type buffer region 2, p type impurity region 3a and $p^+$ impurity region 3b, respectively, satisfies the following expression.

$$2 \times C_{S(nbuf)} \leq C_{S(p)} \leq 1.1 \times \sqrt{C_{S(nbuf)} \times \{C_{S(p+)} + C_{S(p)}\}}$$

In the example described above, ratio of the areas of p type impurity region 3a and $p^+$ impurity region 3b at the collector surface is 50% for each. When this ratio of area is changed, amount of holes implanted from p type collector region 3 to $n^-$ region 1 is also changed. Accordingly, amount of holes implanted from p type collector region 3 to $n^-$ region 1 can be controlled by changing the shape of the resist pattern used as a mask upon ion implantation for forming $p^+$ impurity region 3b.

Figure 16:
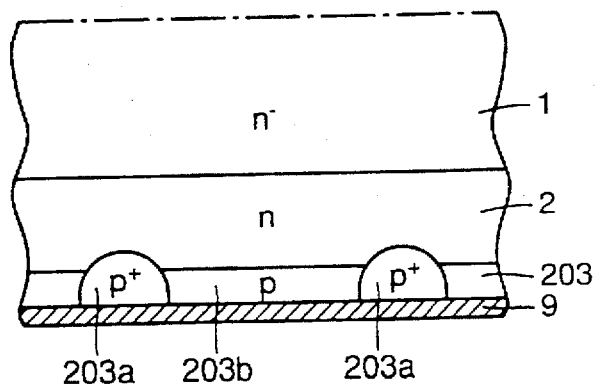
FIG. 16 is a schematic cross sectional view showing a structure of a semiconductor device at the side of the anode (collector) disclosed in the publication.

In Japanese Patent Laying-Open No. 6-326317 mentioned previously, the values of impurity concentration in the structure shown in FIG. 16 are $1 \times 10^{19}$ $cm^{-3}$ at emitter island 203a, $1 \times 10^{18}$ $cm^{-3}$ at p type transmission emitter region 203b, and $3-10^{16}$ $cm^{-3}$ at n buffer region 2.

Therefore, if each of these impurity concentrations is considered as the impurity concentration at the collector surface, the following expression is obtained, departing from the range of the above-described ratio K2.

$$1.1 \times \sqrt{3 \times 10^{16} \times 1.1 \times 10^{19}} \approx 6 \times 10^{17} < C_{S(p)}$$

Thus, it can be seen that, in the structure of FIG. 16 according to this publication, turn-off loss is made higher. as compared to the structure of the present embodiment.

In the above publication, impurity concentration of p type transmission emitter region 203b is set at a relatively high value. However, this value is based on the assumption that diffusion depth of p type transmission emitter region 203b is shallow, and as has been described above, shallow diffusion depth of region 203b causes problem in the process of manufacturing.

In the structure of the present embodiment, diffusion depth of p type impurity region 3a from the emitter surface is set at 2.0 µm or deeper. Accordingly, junction portion of p type impurity region 3a and n type buffer region 2 is not likely to be affected by the various types of stresses upon process of assembly such as die bonding. In addition, since diffusion depth of p type impurity region 3a from the emitter surface is acceptable if it is not shallower than 2.0 µm, it is not necessary to consider so strictly the thermal treatment at the time when other impurity diffusion regions such as $n^+$ emitter region are formed during the wafer process.

It is common in the design of so-called punch-through type (or pin structure) elements that depletion layer is extended beyond $n^-$ region 1 so that n type buffer region 2 is also depleted when a high voltage is applied between collector and emitter. In a punch-through type IGBT, thickness of non-depleted n type buffer region 2 corresponds to the width of the base of internal pnp transistor, and this thickness is in close relationship with the rate of amplification at the time in which bipolar operation is perfomed. Since lower rate of amplification of pnp transistor leads to a more stable operation during high voltage operation, this non-depleted n type buffer region 2 must be left with a thickness of some extent.

To set the thickness of n type buffer region 2 at 30 µm and to leave the above-described non-depleted n type buffer region 2 with a thickness of 10 µm or more to reach $p^+$ diffusion region 3b, the surface concentration of n type buffer region 2 needs to be $1 \times 10^{16}$ $cm^{-3}$ or more. This value can be obtained by a calculation in which the intensity of electric field generated in the depleted region of n type buffer region 2 is set at $1 \times 10^5$ V/cm and the diffusion junction depth of $p^+$ diffusion region 3b from the collector surface with respect to n type buffer region 2 is set at 5 µm.

In this case, a breakdown voltage of about 5000 V is required for a punch-through type element. Thus, $n^-$ region (substrate) 1 of about 500 Ω·cm (≡impurity concentration $1 \times 10^{13}$ $cm^{-3}$) is employed so that the surface concentration of n type buffer region 2 ($1 \times 10^{16}$ $cm^{-3}$ or higher) would be 1000 times or more than the concentration of $n^-$ substrate 1.

Also, in the structure of the present embodiment shown in FIG. 1, pn junction of p type collector region 3 and n type buffer region 2 is formed entirely at the collector surface. Accordingly, a reversed breakdown voltage of at least about 30 V can be obtained at this junction portion. Therefore, there is no problem of inaccurate operation even when a reverse voltage is applied to the IGBT of the present embodiment.

Also, in the structure of the semiconductor device in accordance with the present embodiment, the variation of implantation levels at various locations within the chip is small such that operations obtained within the chip would be uniform.

There is no specific limitation on the two-dimensional arrangement (pattern) of p type impurity region 3a and $p^+$ impurity region 3b. However, arrangement in which a two-dimensional distribution of hole implantation from p type collector region 3 to $n^-$ region 1 is made too coarse with respect to the repeated pattern of the channel portion of the IGBT should be avoided in order to maintain a uniform operation. Therefore, the repetition pitch of p type impurity region 3a and $p^+$ impurity region 3b is preferably made sufficiently narrow with respect to the thickness of n⁻ region 1. Specifically, a pitch of the order of several μm to several tens of μm is appropriate.

Figure 9:
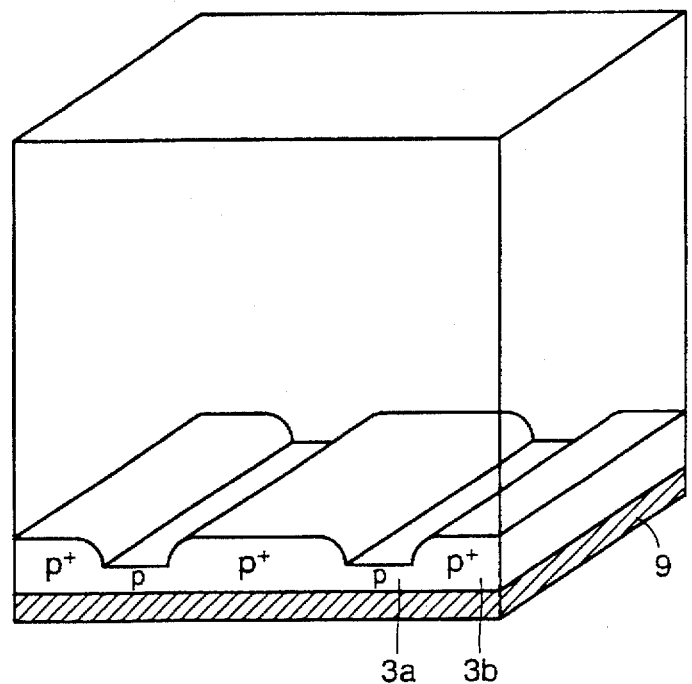
FIG. 9 is a schematic perspective view showing a structure in which p type impurity regions and p$^+$ impurity regions are placed in form of stripe when viewed two-dimensionally.
Figure 10:
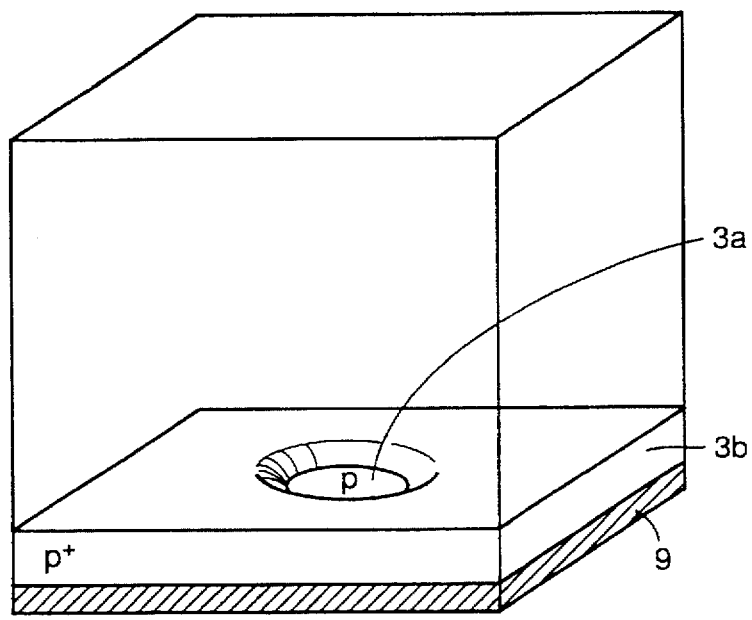
FIG. 10 is a schematic perspective view showing a two-dimensional arrangement in a structure including p type impurity region and p$^+$ impurity region.
Figure 11:
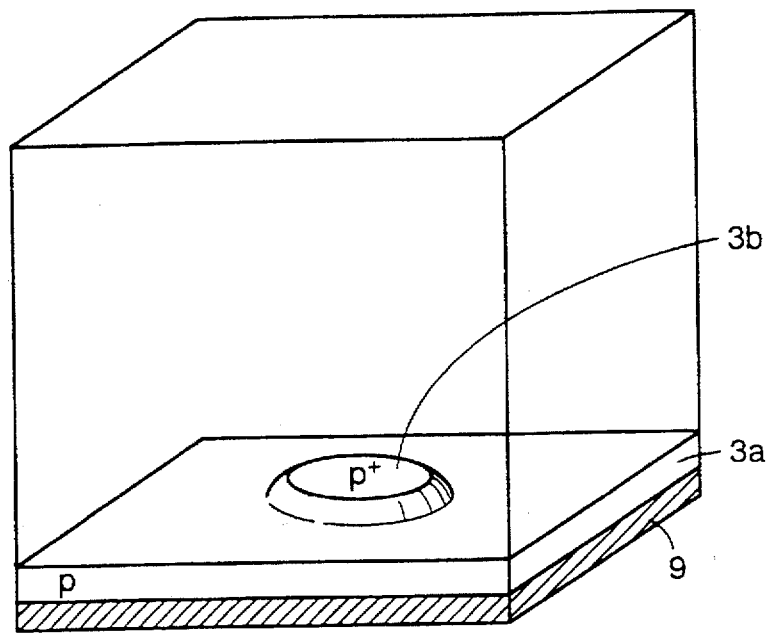
FIG. 11 is a schematic perspective view showing a two-dimentional arrangement in a structure including p type impurity region and p$^+$ impurity region.

If the pitch is provided as described above, for example, in a stripe pattern as shown in FIG. 9, arrangement of p type impurity region 3a and p⁺ impurity region 3b may be at any angle to the pattern of the channel portion. Also, the present invention can be applied to a pattern in which p⁺ impurity region 3b is distributed entirely with islands of p type impurity region 3a therein as shown in FIG. 10, or a pattern in which p type impurity region 3a is distributed entirely with islands of p⁺ impurity region 3b therein as shown in FIG. 11.

In addition, when ratio of area of p⁺ impurity region 3b with respect to p type impurity region 3a is made higher, implantation of holes from p type collector region 3 to n⁻ region 1 is increased. Thus, if hole implantation within the IGBT chip is to be suppressed at, for example, the peripheral portion of the chip, it is also possible to meet this requirement by reducing the ratio of area of p⁺ impurity region 3b with respect to p type impurity region 3a at this portion.

In the structure of the semiconductor device according to the present embodiment, amount of holes implanted varies quite sensitively according to the ratio of each value of the impurity concentrations for n type buffer region 2, p type impurity region 3a, and p⁺ impurity region 3b. Accordingly, upon implantation of these impurities, an ion implantaion machine is employed. If possible, it is desirable to perform impurity implantation to these regions by the same apparatus.

In addition, although description has been made for a planar type n channel IGBT in accordance with the semiconductor device of the present embodiment, the present invention is also applicable to trench type or p channel type IGBT, and moreover, to other types of bipolar elements in which implantation level of minority carrier needs to be controlled.

Generally, substrate 1 is doped with an impurity of n or p type for resistivity control. In the present embodiment, the impurity implanted is of n type. However, when a bipolar type element is turned on, sufficient amount of electrons which is the current carrier as well as holes are stored within this n⁻ region 1 to cause conductivity modulation, and thus n⁻ region (substrate) 1 may be considered as an intrinsic semiconductor substrate in some instances.

Although the present invention has been described and illustrated in detail, it is clearly understood that the same is by way of illustration and example only and is to be taken by way of limitation, the spirit and scope of the present invention being limited only by the terms of the appended claims.

What is claimed is:

1. A semiconductor device in which main current flows between first and second main surfaces with an intrinsic substrate or a substrate of a first conductivity type therebetween, comprising:

a first impurity region of a second conductivity type formed selectively at said first main surface of said semiconductor substrate;

a second impurity region of the first conductivity type formed selectively at said first main surface in said first impurity region;

a gate electrode layer formed on a channel region which is said first ipurity region between a region of the first conductivity type of said semiconductor substrate and said second impurity region, with a gate insulating layer therebetween;

a third impurity region of the second conductivity type formed at said second main surface so as to sandwich said region of the first conductivity type of said semiconductor substrate with said first impurity region;

a fourth impurity region of the first conductivity type located between said third impurity region and said region of the first conductivity type of said semiconductor substrate, having an impurity concentration higher than that of said region of the first conductivity type of said semiconductor substrate, wherein said third impurity region has a fifth impurity region having a first impurity concentration at said second main surface and a sixth impurity region having a second impurity concentration higher than said first impurity concentration at said second main surface, a relationship expressed as:

$$C_{S(p)} \leq 1.1 \sqrt{C_{S(nbuf)} \times \{C_{S(p+)} + C_{S(p)}\}}$$

is satisfied, wherein said first impurity concentration of said fifth impurity region is $C_{S(p)}$, said second impurity concentration of said sixth impurity region is $C_{S(p+)}$, the impurity concentration of said fourth impurity region at said second main surface is $C_{S(nbuf)}$, diffusion depth of said fifth impurity region from said second main surface toward said fourth impurity region is not lower than 2.0 μm, and said fifth impurity region has a diffusion depth from said second main surface toward said fourth impurity region which is shallower than the diffusion depth of said sixth impurity region from said second main surface toward said fourth impurity region.

2. The semiconductor device according to claim 1, wherein said first impurity concentration $C_{S(p)}$ of said fifth impurity region and impurity concentration $C_{S(nbuf)}$ of said fourth impurity region at said second main surface satisfy a relationship expressed as:

$$2 \times C_{S(nbuf)} \leq C_{S(p)}.$$

3. The semiconductor device according to claim 1, wherein impurity concentration $C_{S(nbuf)}$ of said fourth impurity region at said second main surface is not lower than 1000 times the impurity concentration of said region of the first conductivity type of said semiconductor substrate.

4. The semiconductor device according to claim 1, wherein a plurality of said fifth impurity regions and a plurality of said sixth impurity regions are arranged to extend alternately at said second main surface.

5. The semiconductor device according to claim 1, wherein said fifth impurity region surrounds the entire periphery of said sixth impurity region at said second main surface.

6. The semiconductor device according to claim 1, wherein said sixth impurity region surrounds the entire periphery of said fifth impurity region at said second main surface.

* * * * *